United States Patent [19]

Berger et al.

[11] Patent Number: 4,611,234
[45] Date of Patent: Sep. 9, 1986

[54] ANALYSIS PROCESS OF A LINE TRANSFER PHOTOSENSITIVE DEVICE AND OPERATING DEVICE OF SUCH A PROCESS

[75] Inventors: Jean-Luc Berger, Grenoble; Louis Brissot, St. Egreve; Yvon Cazaux, Grenoble, all of France

[73] Assignee: Thomson-CSF, Paris, France

[21] Appl. No.: 562,462

[22] Filed: Dec. 16, 1983

[30] Foreign Application Priority Data

Dec. 21, 1982 [FR] France ................................ 82 21396
Sep. 9, 1983 [FR] France ................................ 83 14403

[51] Int. Cl.$^4$ ............................................. H04N 3/14
[52] U.S. Cl. ................................................... 358/213
[58] Field of Search .................. 358/213, 44, 41, 212; 357/24 LR; 250/578

[56] References Cited

FOREIGN PATENT DOCUMENTS 0029351 5/1981 European Pat. Off. .
0064890 11/1982 European Pat. Off. .

OTHER PUBLICATIONS

IEEE Electron Device Letters, vol. EDL-1, No. 5, May 1980, pp. 86-89, IEEE, New York, USA—S. Terakawa et al.: "A New Organization Area Image Sensor with CCD Readout Through Charge Priming Transfers", p. 86, right col., line 9-p. 87, left col., line 11.

Primary Examiner—Gene Z. Rubinson
Assistant Examiner—Stephen Brinich
Attorney, Agent, or Firm—Roland Plottel

[57] ABSTRACT

The present invention concerns an analysis process of a line transfer photosensitive device.

The charge-signal and the charge noise transfers from the columns towards the memory have the same duration and are made by using a same training charge, stored in memory, that must be at least sufficient to allow to pass in high inversion at the beginning of the transfer from the columns towards the memory. The transfers of the charge-signal and the charge-noise from the memory towards the read-out register or the drain have the same duration and are made by using training charges at least sufficient to allow to pass in high inversion at the beginning of the transfer. These training charges are read with the charge-signal or collected with the charge-noise.

26 Claims, 17 Drawing Figures

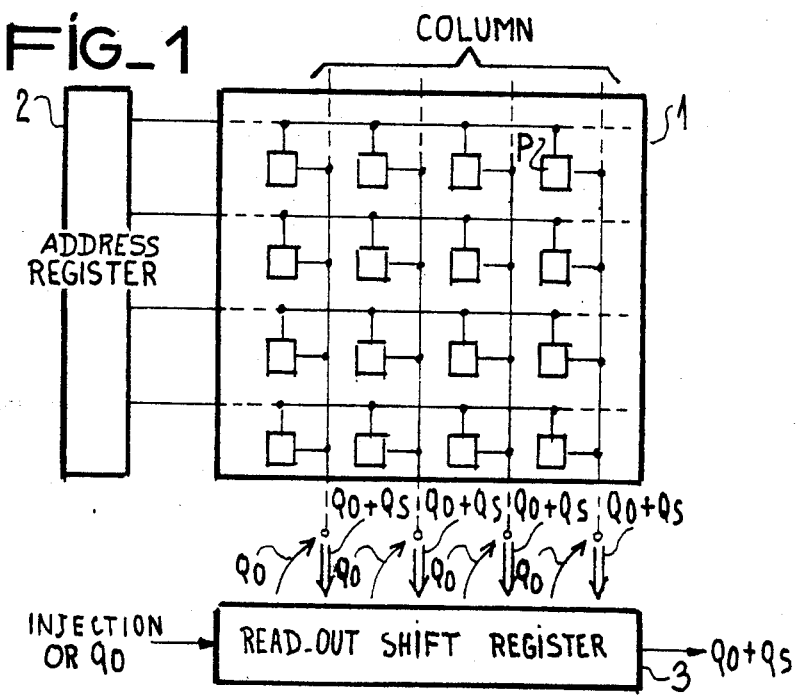
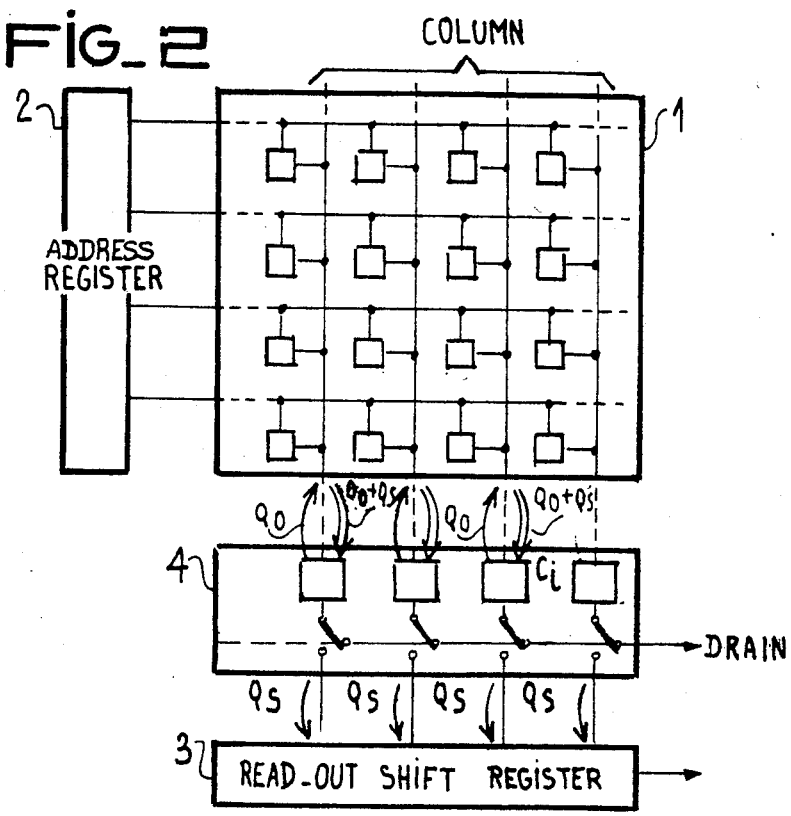

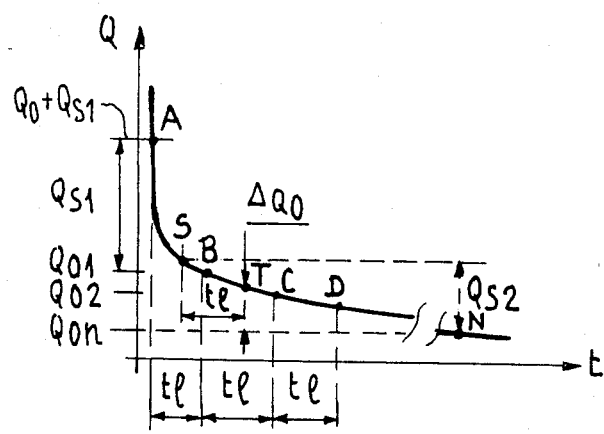
FIG_3
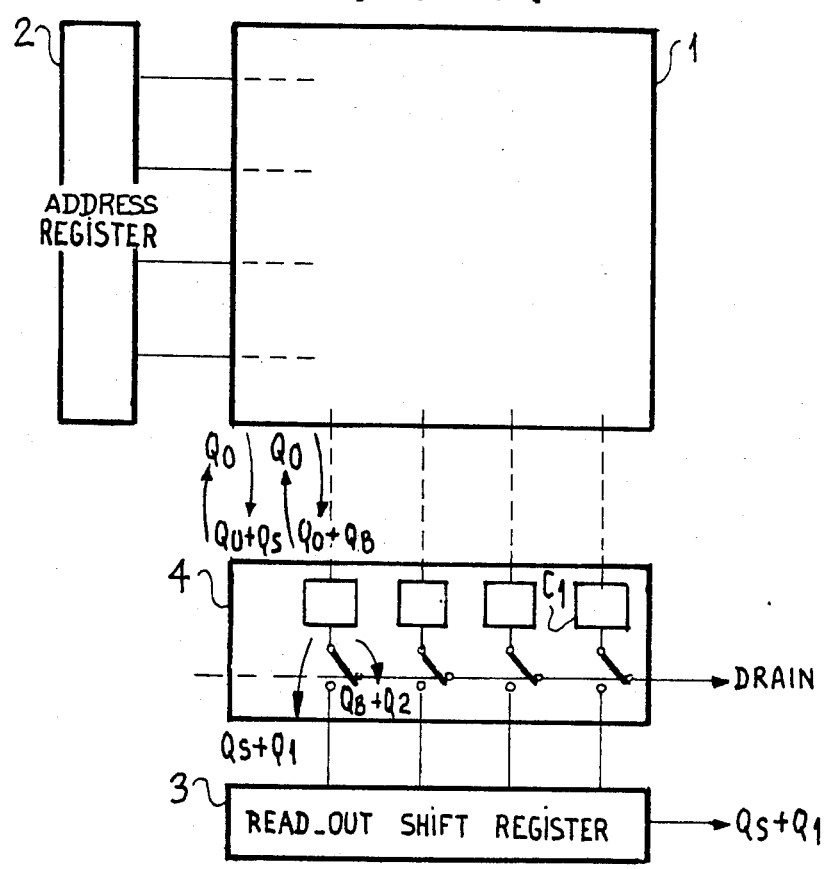
FIG_4

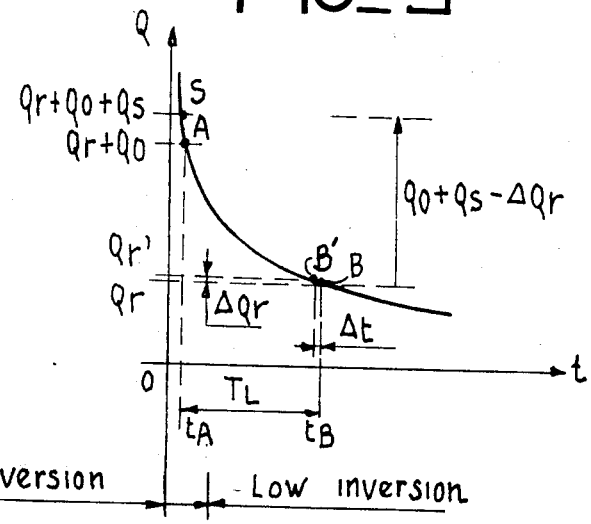
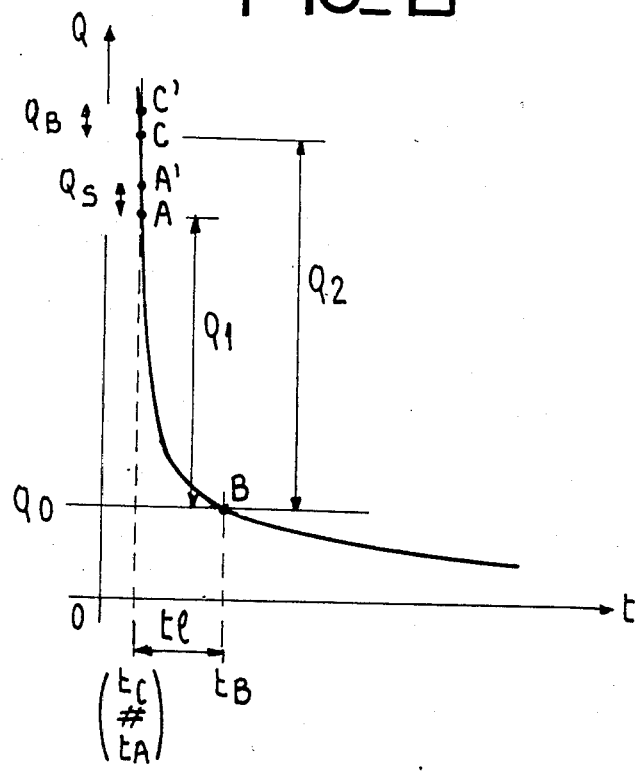

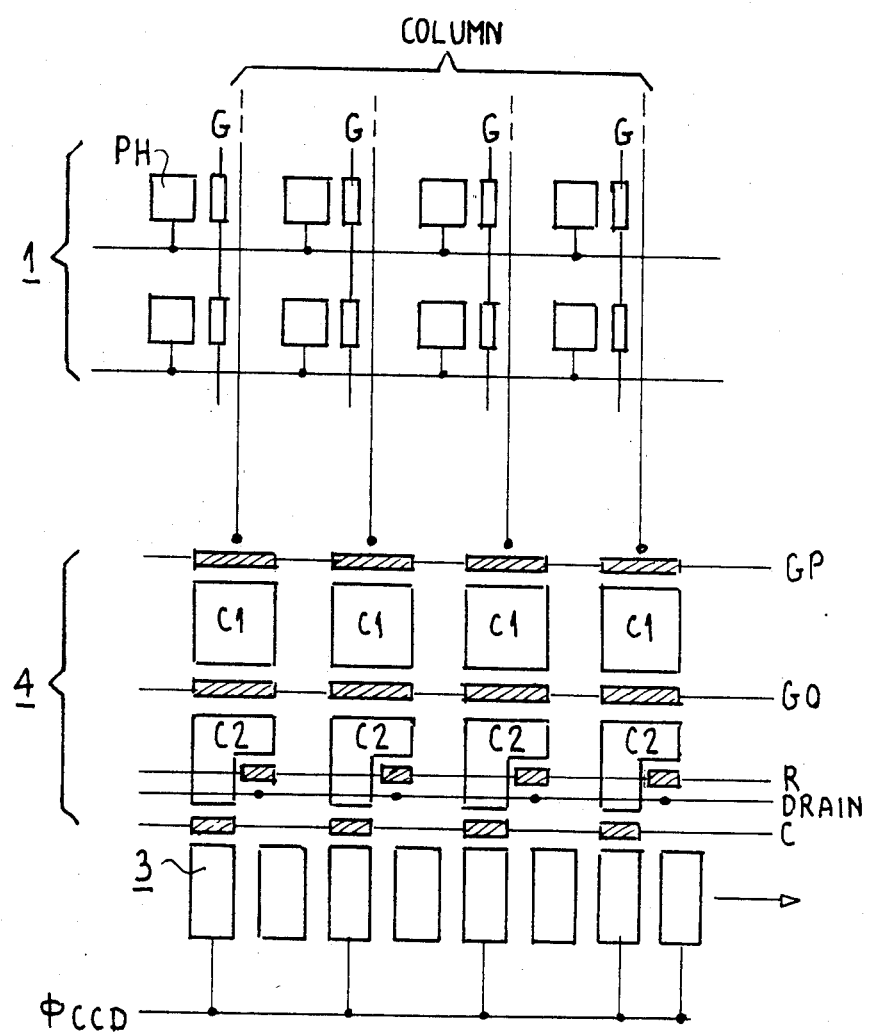
FIG_7

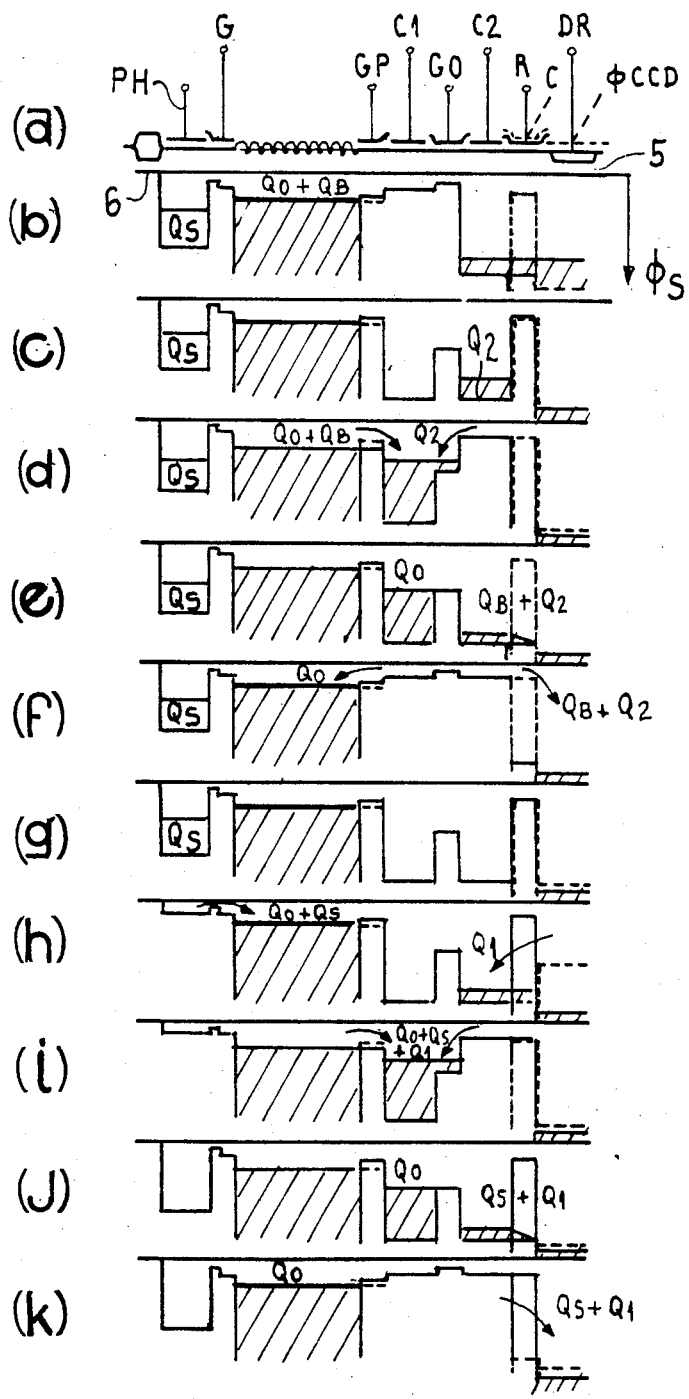

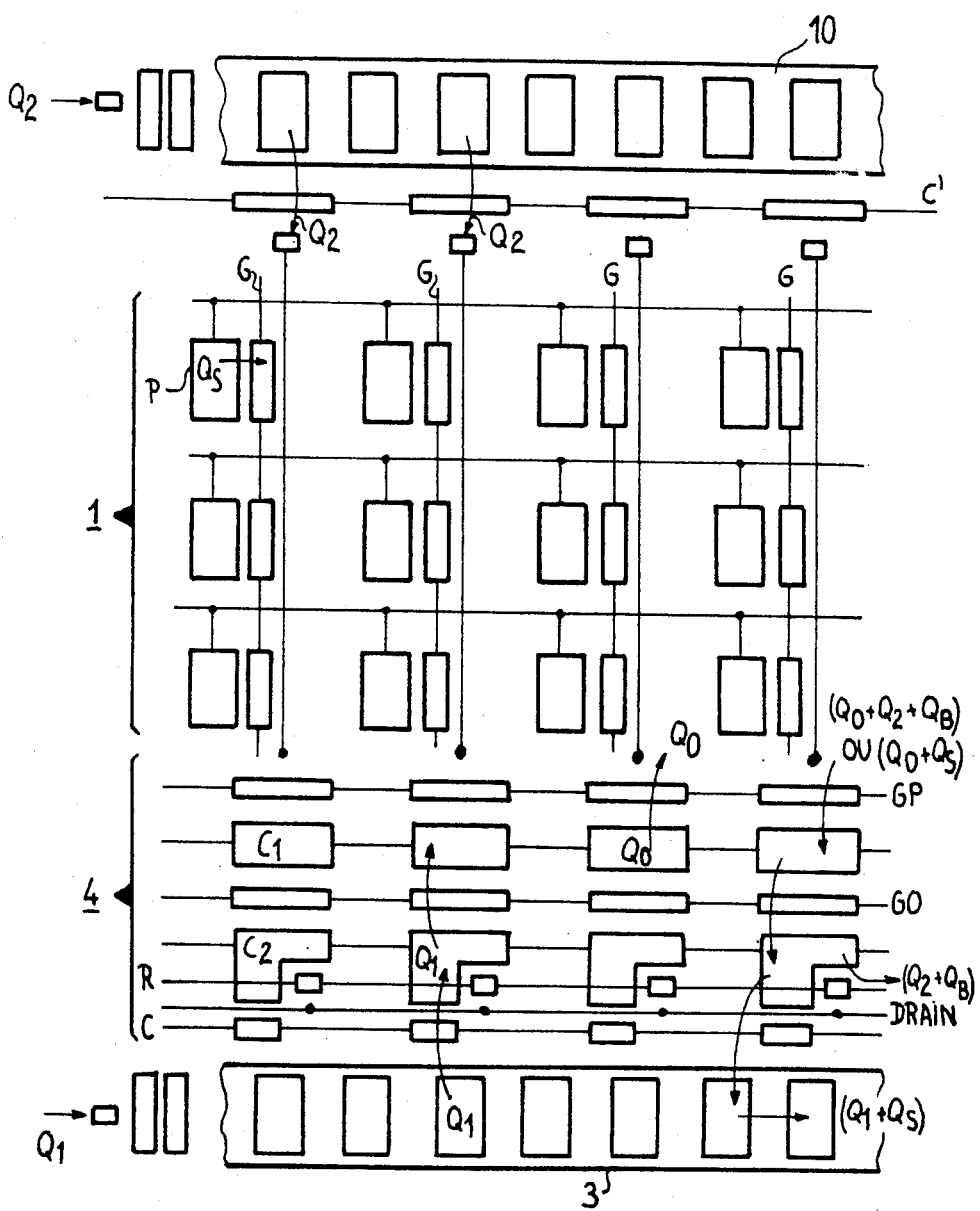
Fig_9

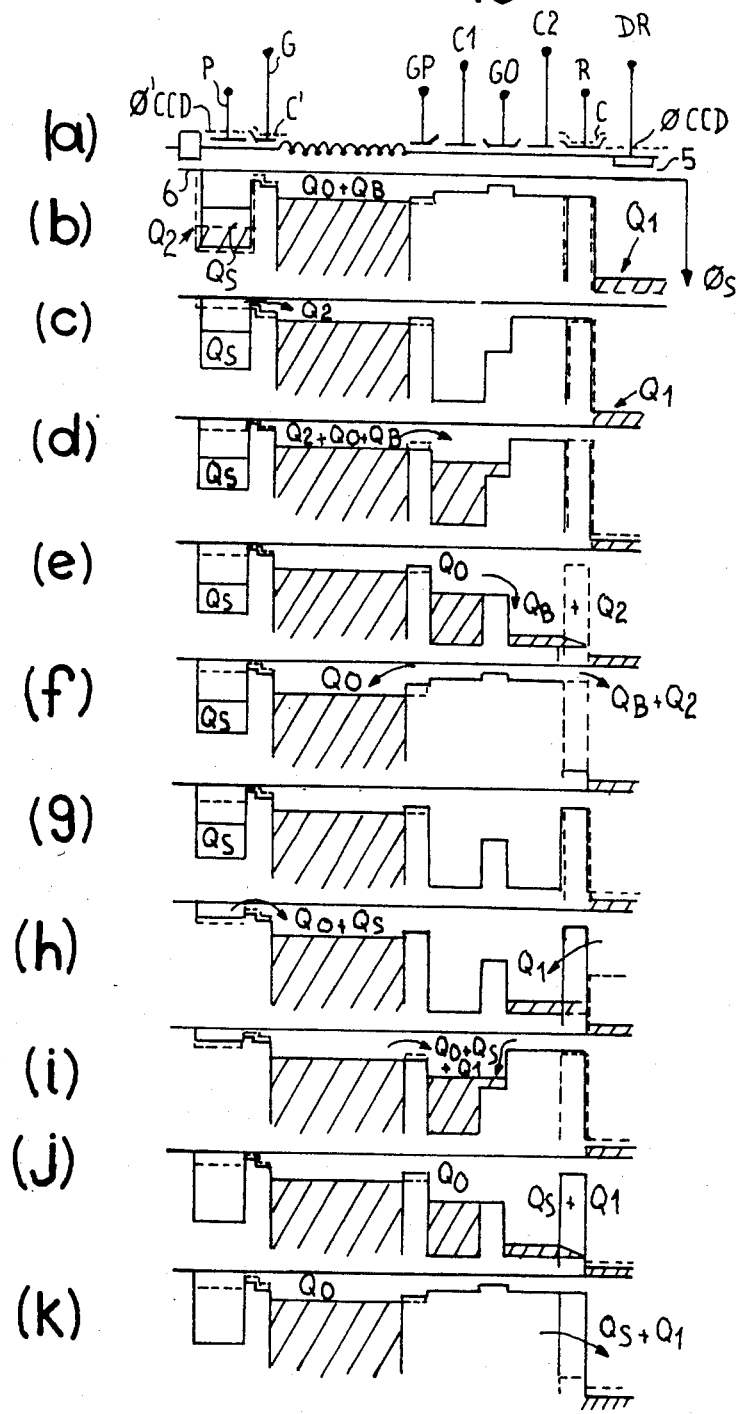

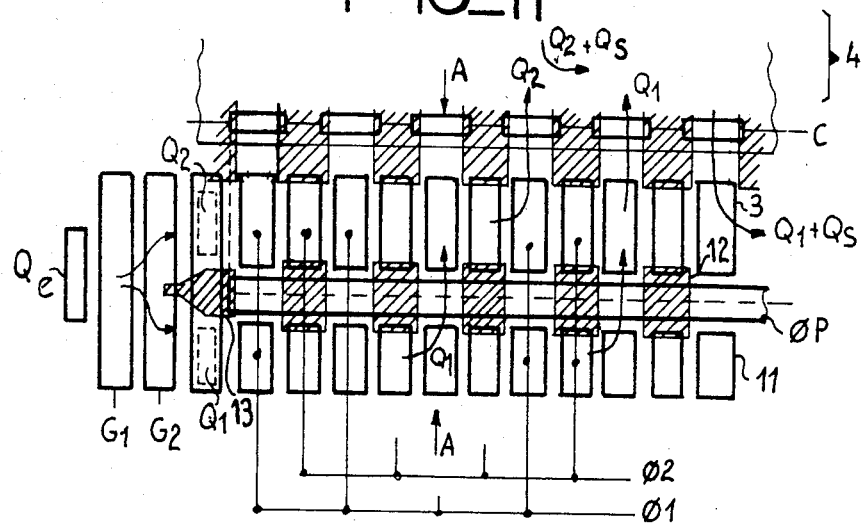
FIG_11
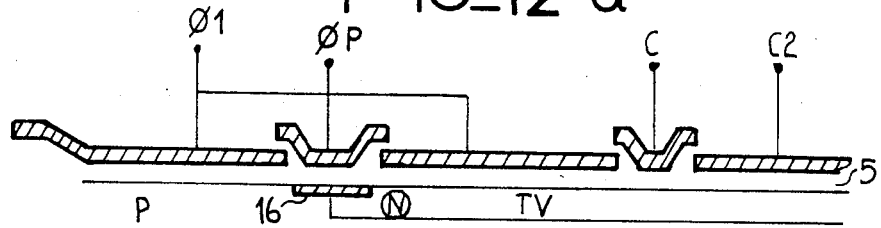
FIG_12-a
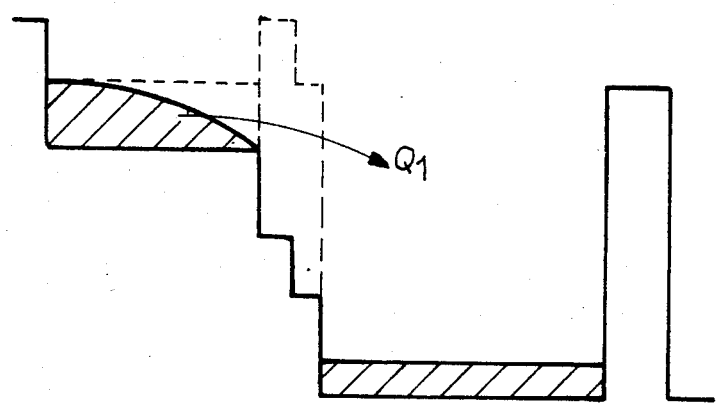
FIG_12-b

FIG_14
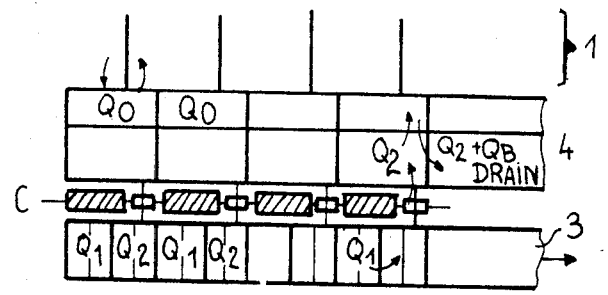
FIG_15
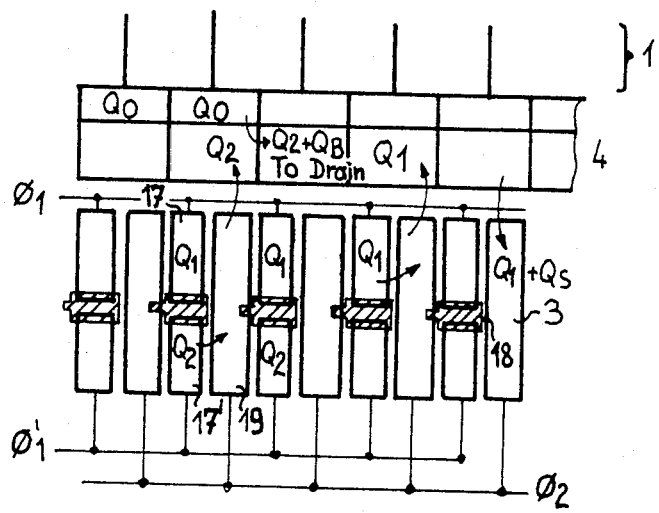
FIG_13
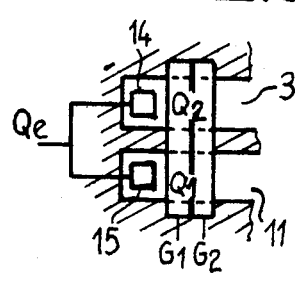
FIG_16
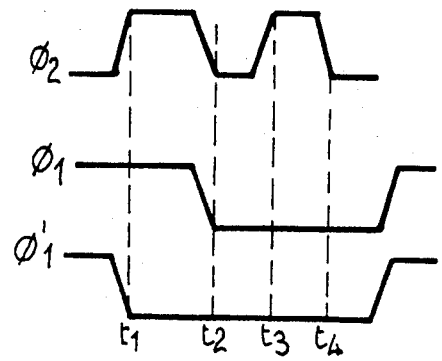

ANALYSIS PROCESS OF A LINE TRANSFER PHOTOSENSITIVE DEVICE AND OPERATING DEVICE OF SUCH A PROCESS

BACKGROUND OF THE INVENTION (1) Field of the Invention

The present invention concerns an analysis process of a line transfer photosensitive device. It also concerns an operating device of such a process.

(2) Description of the Prior Art

Photosensitive devices of which the analysis is carried out by line transfer are known in the prior art, especially through U.S. Pat. Nos. 4,430,672 and 4,506,299, each assigned to THOMSON-CSF. However, these devices present drawbacks at the level of efficiency of the charge-signal transfer.

SUMMARY OF THE INVENTION

The present invention thus seeks, with respect to the known solutions that will be set out in the detailed description of the figures, to improve the efficiency of the charge-signal transfer from the conducting columns addressing the photosensitive points up to the read-out register. In fact, the present invention seeks to improve the efficiency of the transfer without degrading certain characteristics of the line transfer photosensitive device, such as;

the noise added to the signal read;

the quantity of charge that must contain the read register. Indeed, if this charge quantity is important it requires a large size register, thus a high control phase power and important couplings between the control phases;

the vertical resolution at low-level light.

The present invention also seeks to ensure an efficient transfer of charge noise from the columns until the collector or evacuation drain, without disturbing the charge-signal transfer and without using collectors at the level of the photosensitive zone.

The present invention concerns an analysis process of a line transfer photosensitive device, this device comprising a photosensitive zone of M lines of N photosensitive points, the photosensitive points of the different lines being connected in parallel by conducting columns to a memory that ensures the transfer towards a read-out register of the charge-signal of a single line and which ensures the transfer towards a collector of the charge-noise present on the columns prior to the intake of the charge-signal.

According to one characteristic of the invention, the analysis of each line of the photosensitive zone is realized by transferring the charge-signal towards the memory, by superimposing on the charge-signal at least one first training charge sufficient to pass in high inversion at the beginning of the transfer of the columns towards the memory, this first training charge being stored in memory and transferred onto the columns prior to the charge-signal intake, a second training charge, at least sufficient to allow to pass in high inversion at the beginning of the transfer, being superimposed on the charge-signal at the moment of transfer towards the read-out register, this second training charge being read with the charge-signal.

According to another characteristic of the invention, the collection of the charge-noise present on the columns prior to the intake of the charge-signal comprises the following steps:

(1) transfer of the charge-noise of the columns towards the memory by superimposing on it the same first training charge as for the charge-signal, the transfer having the same duration as the transfer of the charge-signal of the columns towards the memory and the first training charge still being stored in memory and periodically transferred onto the columns;

(2) transfer of the charge-noise of the memory towards the collector by superimposing on it a third training charge at least sufficient to allow to pass in high inversion at the beginning of the transfer, this transfer having the same duration as the transfer of the charge-signal transfer of the memory towards the read-out register, and this third training charge being evacuated with the charge-noise towards the collector.

BRIEF DESCRIPTION OF THE DRAWINGS

Other objects, characteristics and results of the invention will appear from the following description given by way of non-limitative example and illustrated by the annexed drawings in which:

FIGS. 1 and 2 are schemes illustrating two analysis processes according to the prior art of a line transfer photosensitive device FIG. 3 is a curve showing how is carried out in the process of FIG. 2, the transfer of the charge-signal of the intermediate capacitances of the memory towards the read-out register;

FIG. 4 is a scheme illustrating the analysis process according to the invention;

FIGS. 5 and 6 are curves showing how is carried out, in the process according to the invention, the transfers from the column charge towards the intermediary capacitances and from the intermediary capacitances towards the read-out register;

FIG. 7 is a scheme of a device for operating the process according to the invention;

FIGS. 8(a) to (k) are transversal cross-section views of the device of FIG. 7 and schemes explaining its operation;

FIG. 9 is a scheme of a second embodiment of the injection of the third training charge according to the present invention;

FIGS. 10(a) to (k) are transversal cross-section views of the device of FIG. 9 and schemes explaining its operations;

FIG. 11 is a partial scheme of a third embodiment of the injection of the third training charge according to the present invention;

FIGS. 12(a) and 12(b) are transversal cross-section views along A—A of FIG. 11 and a scheme explaining its operation;

FIG. 13 is a scheme of another embodiment of the input stage of the device of FIG. 11;

FIG. 14 is a partial scheme of a fourth embodiment of the injection of the third training charge according to the present invention;

FIG. 15 is a partial scheme of a fifth embodiment of the injection of the third training charge according to the present invention;

FIG. 16 is a time diagram of the phases applied on the register used in FIG. 15.

DESCRIPTION OF THE PREFERRED EMBODIMENT

On the different figures, the same references designate the same elements, but for reasons of clarity, the dimensions and proportions of the various elements have not been respected.

FIG. 1 is a scheme illustrating an analysis process of a line transfer photosensitive device according to the prior art. This process is described in the article published in the periodical I.E.E.E. Journal of Solid State Circuits, volume SC 15, No. 2, April 1980, page 206.

FIG. 1 schematically represents a photosensitive zone 1, constituted by a matrix of M lines each comprising N photosensitive points P. This zone receives the luminous image to be analyzed and transforms it into electric charges, called charge-signal. The photosensitive points of a single line are joined to one another and connected to an addressing register 2 that allows to select one line of the matrix. The photosensitive points of one line are connected to a single conducting column.

The charge-signal created in each of the photosensitive points of a single line is transferred in parallel towards a read-out register 3 that supplies the data received in parallel, in series. This data constitutes the video signal of the optical image analysis received on the photosensitive zone 1. The register is preferably of the CCD type charge transfer register.

In the prior art, constituted for example, by the two patents mentioned herein-above, it has been shown that the efficiency of the transfer is improved by superimposing a training charge $Q_O$ at each charge-signal $Q_S$; this improvement is above all noticeable when the charge-signal is of low amplitude.

In the article of I.E.E.E. already cited, the training charge is supplied by the read-out register itself. In this case, there is a permanent injection of a quantity of charges $Q_O$ in the register. The training charge $Q_O$ is transferred onto each of the columns prior to the intake of the charge-signal on the column, as is symbolised on FIG. 1 by an arrow leading from the register towards each column. Then the whole $Q_S+Q_O$, charge-signal plus the training charge, is transferred from each column to the read-out register and from there in serie to the output. The transfer of $Q_S+Q_O$ of the columns towards the register is symbolized by a double arrow on the figure.

The drawbacks of the analysis process of a transfer line photosensitive device are the following.

Taking into account the relatively large capacity of the columns when the number of lines is high, the training charge $Q_O$ must be important before the maximum charge-signal. For example, the capacitance of the columns is about 3 pf for 625 lines, which leads to using a training charge $Q_O$ of about 1 pc for a maximum charge-signal of 0.2 pc. This has undesirable consequences:

at the output of the read-out register, $Q_S+Q_O$ and not simply $Q_S$ is obtained. The temporal noise is thus dominated by the noise due to the charge $Q_O$. It is not possible to inject a high charge into a charge transfer register without superimposing on it a noise bound to the input capacitance of the register and the injection method. The input capacitance of the register, and thus of the associated noise, are as important as the $Q_O$ is high. The training charge $Q_O$ being important, one of the advantages of the line transfer, which is to allow low-noise reading, is lost.

Futhermore, it is necessary to contain in the read-out register not $Q_S$ but $Q_S+Q_O$. A larger size register is thus necessary, as well as a higher control phase power and more important couplings between the control phases.

Another drawback of the process illustrated by FIG. 1 is that the evacuation of the charge noise due to the "smearing" or the "blooming" can only be realized by drains situated adjacent to the photosensitive points The assignee of the present application considers that it is preferably that the reading of the charge noise, like that of the charge-signal, is carried out by using a training charge $Q_O$.

Then, only a single charge quantity $Q_O$ is available for each column; since $Q_O$ is transferred towards the output with the charge-signal, it is not possible to dispose of a training charge $Q_O$ to read the charge noise. It would thus be necessary to use drains situated at the level of each photosensitive point.

FIG. 2 is a scheme illustrating another analysis process of a line transfer photosensitive device according to the prior art. This process is described in U.S. Pat. No.4,506,299.

FIG. 2 also shows, with respect to FIG. 1, the presence between the photosensitive zone 1 and the read-out register 3 of a line memory 4. This memory comprises a series of intermediary capacitances $C_i$, each capacitances being connected, on the one hand, to a column and, on the other hand, to switchover means symbolized by switches 1 and leading the contents of the intermediary capacitances either twoards a drain or towards the read-out register.

According to this process, a training charge quantity $Q_O$ is stored in each intermediary capacitances. This training charge quantity is transferred onto columns prior to the intake of the charge-signal $Q_S$, thereafter the charge quantity $Q_S+Q_O$ is transferred into each intermediary capacitances. These two series of transfers are symbolically represented by arrows on FIG. 2.

It is possible to transfer the charge quantities $Q_S+Q_O$ into the read-out register but it is generally preferable only to transfer thereon the charge quantities which allows the elimination of the noise known as spatial noises existing on $Q_O$ from one column to another and which allows the read-out register not to be overloaded. The transfer from each intermediary capacitances to the read-out register must thus be carried out in such a way as to leave behind the charge quantity $Q_O$. This is realized by a potential barrier that only allows to pass the charge-signal $Q_S$ in excess with respect to $Q_O$.

FIG. 3 shows how is carried out over a time t the charge transfer from each intermediary capacitance towards the read-out register. The characteristic $Q(t)$ of FIG. 3 thus shows the discharge in function of time t of the intermediary capacitances. This characteristic comprises a substantially vertical part, an elbow, then a substantially horizontal part.

The transfer is carried out, first of all, in high inversion and, thereafter, in low inversion.

Thus a charge-signal quantity $Q_{S1}$, such as an intermediary capacitance contains a charge quantity $Q_O+Q_{S1}$ bearing its operating point at the point A of the characteristic $Q(t)$ of FIG. 3, i.e. on the substantially vertical part of this characteristic. After read time $t_1$, the charge $Q_{S1}$ was transferred into the read-out register. The operating point of the capacitance is at the point B of the characteristic, i.e. in the elbow of the characteristic and this capacitance only contains a charge $Q_{O1}$ hardly different from $Q_O$. The transfer of $Q_{S1}$ was efficient since it is carried out in high inversion.

The assignee of the present invention has displayed that the process represented in FIG. 3 has the following drawback.

When the charge-signal quantities that are read-out have values substantially equal to $Q_{S1}$, the operating point on the characteristic of FIG. 3 is displaced between two points close to the point A and the point B. The transfer of $Q_{S1}$ is efficient since it is carried out in high inversion.

In fact, the value of the intermediary capacitances being low, this is displayed by a characteristic $Q(t)$ presenting a substantially vertical part. It is therefore sufficient to have a low value charge-signal $Q_S$—of about 0.05 pc, for example—so that the point A is present on the vertical part of the characteristic and that the transfer be efficient and be carried out in high inversion.

On the contrary, the process represented in FIG. 3 performs far less well when it is necessary to process lines that are not, or only barely, illuminated.

In the absence of lighting, the transfer towards the read-out register is carried out, still over a period of time $t_1$, but from the point B until the point C where the training charge is reduced to the value $Q_{O2}$ so that $Q_{O2} < Q_{O1}$. If several successive lines are without a signal, the operating point will successively pass from C into D . . . then into N. The training charge is little by little reduced and passes from $Q_{O1}$ to $Q_{O2}$ then to $Q_{ON}$. The low inversion transfer that occurs at each reading of the non-illuminated lines ends up by hollowing out a large "pocket" in the training charge $Q_O$. The next charge signal that will follow the black lines will have to fill in this pocket before it is able to be transferred. The transfer of this charge signal will thus be carried out in low inversion with a greatly reduced transfer efficiency.

Let us suppose, indeed, a charge-signal $Q_{S2}$ that causes the operating point to pass from N to S. The transfer during the time $t_1$ leads from the point S to the point T.

The charge transferred into the register passing from the point S to the point T is written as:

$$Q(t_S) - Q(t_T) = Q_{S2} + Q_{ON} - Q(t_T)$$

Let us take: $Q(t_T) = Q_{ON} + \Delta Q_O$, the transfer efficiency will be written as: $\epsilon = (\Delta Q_o / Q_{S2})$.

FIG. 3 shows graphically that $\epsilon$ can be higher than 50%.

The process of the prior art represented by FIG. 3 thus produces a considerable loss of the vertical resolution that is much more sensitive as the light level decreases.

Another drawback of the process represented by FIG. 2 is that like the process of FIG. 1, the collection of the charge noise due to the smearing or the blooming can only be realized by drains situated close to the photosensitive dots.

In the process represented on FIG. 2, the training charge $Q_O$ that is stored in the intermediary capacitances could a priori be used to transfer the charge noise $Q_B$ then the charge-signal $Q_S$ of the columns into the intermediary capacitances. The conservation of $Q_O$ in the intermediary capacitances is carried out by using a potential barrier that only allows to pass the charges in excess with respect to $Q_O$.

The assignee has observed that the conservation of $Q_O$ in the intermediary capacitances during the charge-signal transfers and the charge noise of the intermediary capacitances towards the read-out register raise the two following problems:

two potential barriers are necessary to retain $Q_O$ in the intermediary capacitances, whereas the charges are transferred either towards the drain or towards the read-out register. It is practically impossible to obtain the strict egality of these two barriers. The solution of this problem consists in using a double stage line memory such as that described in U.S. Pat. No. 4,506,299 and which is represented on FIGS. 8 and 9 of that application;

FIG. 3 and its commentary have shown the problems that are raised during the charge-signal transfer of the intermediary capacitances towards the read-out register, by retaining $Q_O$ in the intermediary capacitances and this when the lines that are not, or only barely, illuminated are processed. When the charge noise is transferred from the intermediary capacitances towards the read-out register, $Q_O$ being retained in the intermediary capacitances, the following problem thus occurs. It has been seen that in the absence of lighting, the transfer is always carried out towards the read-out register, during a time $t_1$ and that the training charge is thus reduced. The intake of the charge noise does not necessarily allow to pass again into high inversion, but allows to give back to the training charge a value more or less close to $Q_O$ according to the quantity of charge noise that is transferred. If the next quantity of charge-signal to be transferred is substantially null a charge quantity is, even so, read that is practically proportional to the charge noise previously read out and that has more or less restored $Q_O$. There is thus a very poor efficiency for the collection of the charge noise.

FIG. 4 is a scheme illustrating the analysis process of a line transfer photosensitive device according to the invention.

As in the process represented in FIG. 2, a training charge quantity $Q_O$ is stored in the memory in each intermediary capacitance and transferred onto the columns prior to the intake of the charge-signal $Q_S$. Thereafter, the charge quantity $Q_O + Q_S$ is transferred into each intermediary capacitance, and likewise for each reading.

FIG. 5 shows how is carried out in time the transfer of the charges from the columns to the intermediary capacitances. This characteristic $Q(t)$ presents an elbow much more pronounced than the characteristic of FIG. 3 since the capacity of the columns is much more important—about ten times more important—than that of the intermediary capacitances.

Let us suppose that there was no charge-signal to be transferred from the columns towards the memory, the operating point is situated at the point A of the curve represented in FIG. 5. The charge to be transferred equals: $Q_O + Q_r$, with $Q_O$ the training charge stored in the intermediary capacitances and $Q_r$ a residual charge.

After a reading time $T_L$, the operating point passes from the point B. The charge $Q_O$ was transferred into an intermediary capacitance. The charge of the column is only $Q_r$. The return of $Q_O$ on the column prior to a new reading of the charge-signal brings the operating point back to point A. In the absence of any charge-signal to be transferred, the charge of the columns moves at each reading between the two balancing positions that are the point A, where the charge is equal to $Q_O + Q_r$, and the point B, where the charge is equal to $Q_r$.

When non null charge-signal $Q_S$ is transferred from the photosensitive zone onto a column, the operating point passes into S where the charge equals: $Q_O+Q_r+Q_S$.

After reading time $t_L$, the operating point passes into a point B' very close to B, where the charge equals $Q'_r$. The point B' is very close to the point B since the inclination of the characteristic $Q_{(t)}$ is very high at the point A and low at the point B.

The fact that the point B' is distinct from the point B signifies that a quantity of charge $\Delta Q_r$ have not been transferred.

The charge transferred on one intermediary capacitance when the operating point passes from S into B is written as follows: charge in S charge in B'

$$\overline{Q_r + Q_O + Q_S} - \overline{Q_r'} = Q_O + Q_S - \Delta Q_r,$$

with $\Delta Q_r = Q'_r - Q_r$. Then, $\Delta Q_r$ can also be expressed in function of $Q'(t_B)$, which is the inclination of the characteristic at the point B:

$$\Delta Q_r = \Delta t . Q'(t_B) \qquad (1)$$

where, $\Delta t$ is the projection of the segment BB' on the axis of times.

The projection of the segment SA on the axis of times also equals $\Delta t$, from which the following relation causing to intervene $\Delta t$:

$$Q_S = \Delta t . Q'(t_A) \qquad (2)$$

where, $Q'(t_A)$ is the inclination of the characteristic at the point A.

The efficiency of the transfer is thus expressed by using relations (1) and (2) in function of the ratio of the characteristics to the points B and A:

$$\epsilon = \frac{\Delta Q_r}{Q_S} = \frac{Q'(t_B)}{Q'(t_A)}$$

In order to obtain a good transfer efficiency, it is necessary that the point A be in a steep inclination zone, thus of high inversion, and that the point B be in a weak inclination zone, thus of low inversion.

According to the invention, the minimum amplitude of the training charge $Q_O$ must be such that it allows to pass in high inversion at the beginning of the transfer of the columns towards the memory, even if there is no charge signal to be transferred. This is the condition to have a good transfer efficiency of the charge of the columns towards the line memory.

This charge quantity $Q_O$ is that much greater as the capacitance of the columns is higher.

Indeed, the inclination of the left-hand part of the curve shown on FIG. 5 that corresponds to an operation in high inversion decreases as the square of the capacitance of the columns. Furthermore, for a given technology, the capacitance of the columns increases with the number of lines to be analysed.

This thus explains the necessity of an important training charge $Q_O$ before the maximum value of the charge signal if it is desired to obtain a good transfer efficiency at the reading of a photosensitive device comprising a high number of lines, 625 lines, for example.

For example, for C columns$\simeq$3.5 pf, it is necessary to select a training charge of about 1 pc, while $Q_S$ is about 0.2 pc, for a reading time $T_L$ of about 2 $\mu$s. A transfer efficiency of about 3% is thus obtained.

According to the invention, the charge-signal transfer of the memory in the read-out register is carried out by superimposing on the charge-signal a training charge $Q_1$. This charge $Q_1$ must be chosen so as to allow to pass in high inversion at the beginning of each transfer of the charges, from the memory towards the register, even when there is no charge-signal to be transferred and by taking into account the fact that $Q_1$ is superimposed on $Q_O$ stored in the memory. Thus the loss of vertical resolution is prevented which occured in the process represented in FIG. 2 when there is no charge-signal to be transferred.

FIG. 6 represents the characteristic Q(t) for the transfer of the memory in the read-out register. The training charge $Q_1$ allows to pass from the point B (where the charge equals $Q_O$) to the point A (where the charge equals $Q_O+Q_1$) or to the point A' (where the charge equals $Q_O+Q_1+Q_S$) when there is a charge-signal to be transferred. The points A and A' are situated in a zone of high inversion.

Thus after reading time $t_1$, the operating point is again substantially in B without dropping below in the absence of the signal.

The training charge $Q_1$ must be supplied at each reading since it is read with the charge-signal.

The training charge $Q_1$ can be supplied in different ways.

These charges can be supplied by the read-out register. In this case, there is permanent injection of a charge quantity $Q_1$ in the register. A training charge $Q_1$ is thus transferred on each intermediary capacitance before the intake of the charge-signal. Thus supplied, the charge quantities $Q_1$ are identical and do not introduce any supplementary spatial noise.

The training charges $Q_1$ can also be injected on each intermediary capacitance from a diode associated to an injection gate. In this case, there is fear of introducing a spacial noise on the charges quantities $Q_1$.

It is also possible to inject training charges $Q_1$ directly at the level of the photosensitive zone by using the technique of shower lighting. In this case a uniform lighting is available that permanently generates in the photosensitive points a charge $Q_1$ that is superimposed on the charge-signal and the training charge $Q_1$ will be read with the charge-signal $Q_S$. As the charge amplitude $Q_1$ is low, the quantum noise associated to its generation is of little importance. On the other hand, the presence of this constant charge in each photosensitive point presents the advantage of improving the transfer of the photosensitive point towards the column and of suppressing the remanence in the case where the photosensitive point is constituted by a photodiode and a photo-MOS.

In the case of a device covered by colored filters, it is essential that the lighting be chosen so as to be transmitted in a uniform manner by the different filters. A lighting in the near infrared, for example, can be used, for which the colored filters all have in general an equivalent transmission.

The intermediary capacitances having a relatively low value, it is sufficient to use a relatively low charge $Q_1$ in order to come back in high inversion at each reading from, for example, the point B of the characteristic Q(t) of FIG. 6. Typically, the training charge $Q_1$ may be about $Q_S$ max/10, where $Q_S$ max represents the highest value of the charge-signal. It is preferable to select the minimum training charge $Q_1$ that allows to come back in high inversion at each reading from point B. Thus the temporal injection noise associated to $Q_1$ is clearly lower than that associated to the charge $Q_O$ transferred in the read-out register in the case of the process of FIG. 1. Neither is there the drawback of the process of FIG. 1 with respect to the total charge quantity that must contain the read-out register since the driving charge $Q_1$ only increases by about 1/10th the dynamic of the signal to be transported in the read-out register.

The charge noise $Q_B$ introduced on the columns by smearing or overlighting must be evacuated towards the drain before the intake of the charge-signal.

The assignee considers it is preferable that the transfer of the charge noise $Q_B$ like that of the charge-signal is carried out with a double training charge.

As concerns the transfer of the columns towards the memory, the same training charge $Q_O$, that is stored in the memory is used to transfer the charge-signal and charge-noise. Thus, the equilibrium potential of the columns, i.e. the point B of the characteristics of FIGS. 5 and 6, is not disturbed. Furthermore, it is necessary that the transfer time $T_L$ is the same for the charge-signal and the charge noise.

With respect to the transfer of charges of the memory towards the drain or towards the read-out register, a training charge $Q_1$ is used to transfer the charge-signal $Q_S$ and a training charge $Q_2$ to transfer the charge noise $Q_B$.

When the transfer of the memory towards the drain or towards the read-out register is achieved, there is a substantial return to the point B of the characteristic of FIG. 6 where the charge is equal to $Q_O$.

It has been seen that the charge $Q_1$ was selected to allow to pass in high inversion at the beginning of each charge transfer from the memory towards the register, even when there is no charge-signal to be transferred. The intake of $Q_1$ on an intermediary capacitance $C_1$ brings the operating point to the point A. The transfer of $Q_S+Q_1$ during the time $t_1$ brings back the operating point close to the point B.

The training charge $Q_2$ is selected, like $Q_1$, in order to allow to pass in high inversion at the beginning of each charge transfer, even if there is no charge noise to be transferred.

The intake of $Q_2$ brings the operating point to the point C then the intake of $Q_B$ brings it to the point C'. The transfer of $Q_B+Q_2$ during the same time $t_1$ as that which is used to transfer $Q_S+Q_1$ brings the operating point close to the point B. On the other hand, the charge $Q_2$ being evacuated, it is not particularly worthwhile to select, as for $Q_1$, the minimum charge allowing to come back in high inversion at each reading of the point B.

The operating point obtained following the transfer of the charge-signal and the charge noise of the memory towards the drain or the register is not strictly the point B since the quantities $Q_S+Q_1$ and $Q_B+Q_2$ are not necessarily the same and since the inclination of $Q(t)$ at the points A' and C' is not infinitive. However, the intermediary capacities having fairly low values, the inclinations at points A' and C' and the ratios $Q'(t_A)/Q'(t_B)$ and $Q'(t_C)/Q'(t_B)$, are high and are thus brought back close to the point B, thus with a charge on the columns that is close to $Q_O$.

From what is set out herein-above, it means that it would be preferable that the training charges $Q_1$ and $Q_2$ be equal, but it is not absolutely obligatory. This depends on the quantity of spatial noise tolerated at the output of the device.

The charges $Q_2$ being evacuated in the drain, while the charges $Q_1$ are read with the signal, the charges $Q_2$ can be introduced in any possible manner, from the moment that their amplitude is sufficient to pass again in high inversion at each transfer from the point B.

The training charge $Q_2$ can be introduced into the memory from the evacuation drain. However, such an introduction method of the charges generally results in a dispersion on the value of the third training charge from column to column of about 20%. On the other hand, the inefficiency of transfer between the intermediary capacitances of the line memory is not null Is thus restored, superimposed on the charge-signal, a residual charge issuing from the third training charge including of any eventual spatial noise bound to the introduction of this third training charge.

Consequently, as explained herein-above, other methods can be used to introduce the training charge $Q_2$.

FIG. 7 is a scheme of a device for operating the process according to the invention using the evacuation drain for the introduction of the training charge $Q_2$.

The top of FIG. 7 represents a photosensitive zone 1. The photosensitive points are disposed in a matrix. A gate G separates each photosensitive point of the column connections. This gate allows to isolate the photosensitive points from the rest of the device during the integration of the charges.

The conducting columns lead to a double stage line memory such as that described in U.S. Pat. No. 4,506,299 and which is represented in FIGS. 8 and 9 of this application.

This memory comprises a series of intermediary capacitances $C_1$ in which are stored the training charges $Q_O$. A gate $G_P$ controls the passage between each column and an intermediary capacitance. The potential of this gate fixes that of the columns.

These intermediary capacitances are followed by switchover means that lead the contents of the intermediary capacitances either towards an evacuation drain or towards a read-out register.

FIG. 7 shows that the intermediary capacitances $C_1$ are followed by gate $G_O$ allowing to retain the driving charges $Q_O$ in the intermediary capacitances and that fix their amplitude. The gates $G_O$ are followed by capacitances $C_2$ that act as dispatchers and allow to send charges coming from $C_1$ either towards the evacuation drain after passage of a gate R, or towards the read-out register 3, after passage of a gate C. The access to each capacitance $C_2$ is controlled by three gates, a gate $G_O$ that allows the intake of the charges and two gates R and C that allows their departure either towards the drain or towards the read-out register.

This double stage line memory allows to retain the training charge $Q_O$ by an independent potential barrier of the dispatching elements either towards the drain, or towards the read-out register.

FIG. 8 is a transversal cross-section view of the device represented in FIG. 7. It is followed by schemes showing the evolution of the surface potential $\phi_S$ in the semi-conductor substrate 5 on which the photosensitive device is integrated, at various instants, taken during one read line sequence made according to the process of the invention. The hatched zones indicate the presence of minority carriers. FIGS. 8b to k only represents the interface 6 of the substrate and the insulating layer that covers it.

FIG. 8b shows the photosensitive points that are integrated from the charges and contain a quantity of charge-signals $Q_S$. On the columns, can be seen the training charge $Q_O$ and charge noise $Q_B$. The drain imposes a certain level of charges in the capacitances $C_2$.

FIG. 8c shows the training charge $Q_2$ isolated under the capacitances $C_2$ by the return of the gate R to the low level.

FIG. 8d shows the transfer of the columns towards the intermediary capacitances of the charge noise $Q_B$ and the training charge $Q_O$ due to the increase of the potential of the gate $G_P$. This transfer is carried out during time $T_L$. Simultaneously, the capacitances $C_2$ pass to the low level and the training charges $Q_2$ are transferred onto the intermediary capacitances $C_1$.

FIG. 8e shows the transfer of $Q_B+Q_2$ of $C_1$ towards $C_2$ then towards the drain during time $t_1$. The capacitance $C_2$ and the gate R are thus at the high level. The training charge $Q_O$ is retained under $C_1$ by $G_O$.

FIG. 8f shows $C_1$ and $C_2$ passing at the low level. The charge $Q_O$ returns onto the columns and the charge $Q_B+Q_2$ is completely evacuated towards the collector.

On FIG. 8g, $C_1$ and $C_2$ return to the high level.

On FIG. 8h, there is a transfer of the charge-signal $Q_S$ of the photosensitive points on the columns where they are added to the charges $Q_O$. Simultaneously, there is a transfer of training charges $Q_1$ in the capacitances $C_2$. These charges issue from the read-out register where they are injected permanently during the previous line time.

It is the passage at the high level of the gate C that allows their transfer into $C_2$.

On FIG. 8i, the passage of the gate $G_P$ at the high level allows the passage of $Q_O+Q_S$ in $C_1$ during a time $T_L$.

Furthermore, the passage of $C_2$ at the low level provokes the transfer of $Q_1$ under $C_1$.

On FIG. 8j, the passage of $C_2$ and the gate C at the high level allows the passage of $Q_S+Q_1$ of $C_1$ towards $C_2$ during the time $t_1$ then towards the register. The charge $Q_O$ is retained under $C_1$ by the gate $G_O$.

On FIG. 8k, the passage of $C_1$ and $C_2$ at the low level provokes the return of $Q_O$ on the columns and the complete transfer of $Q_S+Q_1$ in the register.

On the columns, to the charge $Q_O$ is added the charge noise $Q_B$ and there is a return to the situation of FIG. 8b.

The stages represented on FIGS. 8b to k occur, preferably, during the line return time.

With the device represented on FIG. 7, it is possible to use a process other than that described herein-above to generate the second and third training charges $Q_1$ and $Q_2$.

Thus, the second training charge $Q_1$ can be obtained by using the shower lighting technique, the third training charge $Q_2$ being obtained by injecting continuously the said charge into read-out register 3. In this case, the second training charge $Q_1$ is generated permanently due to a uniform lighting at the level of the photosensitive points they are superimposed on the charge-signal. This second training charge is thus read with the charge-signal $Q_S$. With respect to operating, it is identical to that described with reference to FIG. 8 when it involves the transfer of charges $Q_B+Q_2$ or $Q_S+Q_O+Q_1$ but it differs slightly in the processes used to superimpose the third training charge $Q_2$ on the charge noise $Q_S$. Indeed, in this case, the second training charge $Q_1$ is superimposed on the charge signal $Q_S$ at the level of the photosensitive point and it is the whole of total $Q_S+Q_1$ that is transferred from the photosensitive point on the coresponding column where it is added to the charge $Q_O$.

Furthermore, the third charge $Q_2$ is transferred from the read-out register 3 towards the capacitance $C_2$, the gate R being at the low level and the gate C being at the high level instead of being imposed by the level in the drain.

FIG. 9 is a scheme of another embodiment of a device operating the process of the present invention using a CCD register for the injection of the third training charge $Q_2$.

On this figure, the photosensitive zone 1, the line memory 4 and the read-out register 3 are identical to those of FIG. 7. Consequently, they will not be described again in detail.

However, according to the a represented embodiment, a shift CCD type register 10 having a serie input and parallel outputs is positioned in parallel to the lines of the photosensitive matrix on the side opposite to the read-out register 3. This register 10 is separated from the photosensitive matrix by gates C' that regulate the moment of the transfer of the charges $Q_2$ towards the columns of the photosensitive matrix. The third training charge $Q_2$ is injected continuously in shift register 10 by the intermediary of a known injection type stage constituted by a diode and gates.

The operation of this embodiment will be explained with reference to FIGS. 10(a) to 10(k). FIG. 10(a) is a transversal cross-section view of the device of FIG. 9. This figure represents in a broken line a storage stage of the shift register 10 and a storage of the read-out register 3, these stages being referenced, respectively, by $\phi_{CD}$ and $\phi_{CCD}$.

FIGS. 10(b) to 10(k) are schemes showing the evolution of the surface potential $\phi_s$ in the semi-conductor subtrate 5 on which is integrated the photosensitive device, at various instants taken during a line reading sequence made according to the process of the invention. The hatched zones indicate the presence of minority carriers. FIGS. 10(b) to 10(k) represent simply the interface 6 of the substrate and of the insulating layer that covers it.

According to the present invention, during the line time at which is carried out the serie output of the video signal in the read-out register 3, the second and third training charges $Q_1$ and $Q_2$ are injected in serie in the charge transfer registers 3 and 10 so that the end of the line time $Q_1$ and $Q_2$ are present on the parallel outputs of the registers herein-above.

Due to this fact, at the beginning of line return time, the state of operation is that represented in FIG. 10(b). On this figure, $Q_S$ represents the integrated charge signal at the level of each photosensitive point. Furthermore, the first training charge $Q_O$ and the charge noise $Q_B$ are positioned on the columns and the charges $Q_2$ and $Q_1$ are present in the corresponding stages of the shift registers 10 and 3.

As shown on FIG. 10(c), the charge $Q_2$ is transferred from the shift register 10 towards the columns where is present the principal training charge $Q_O$. To do this, the gate C' is positioned at a high level and the potential $\phi'_{CCD}$ is positioned at a low level.

Thereafter, as represented in FIG. 10(d) the whole of the charges $Q_O$ representing the first training charge, $Q_2$ representing the third training charge and $Q_B$ representing the charge noise such as the blooming charges, for example, is transferred on the columns towards the intermediary capacitance $C_1$ due to the increase of the potential of the gate $G_P$. Simultaneously, the capacitances $C_2$ pass to the low level and the training charges $Q_2$ as well as the charge noise $Q_B$ are transferred towards the capacitance $C_2$ then towards the drain DR, the potential of the gate R being present at a high level, whereas the charge $Q_O$ is maintained in the capacitance $C_1$ by the potential barrier created under the gate $G_O$, as represented on FIG. 10(e).

As represented on FIG. 10(f), the capacitances $C_1$ and $C_2$ pass at the low level. Due to this fact, the charge $Q_O$ returns on the columns and the charge $Q_B+Q_2$ is completely evacuated towards the drain DR.

On FIG. 10(g), the capacitances $C_1$ and $C_2$ return to the high level and the potential of the gate R is brought back to the low level.

Thereafter, as represented in FIG. 10(h), there is a transfer of charges $Q_S$ from the photosensitive points to the columns where they are added to the first training charges $Q_O$. Simultaneously, the second training charges $Q_1$ stored in the storage stages of the read-out register 3 are transferred in the capacitances $C_2$ during the passage at the high level of the gate C.

Then, as represented on FIG. 10(i), the passage of the gate $G_P$ at the high level allows the passage of the charges $Q_O+Q_S$ in the intermediary capacitances $C_1$.

Furthermore, the passage of the capacitance $C_2$ at the low level provokes the transfer of the second training charge $Q_1$ under the intermediary capacitances $C_1$.

As represented on FIG. 10(j), the passage of the capacitances $C_2$ and of the gate C at the high level allows the passage of the charges $Q_S+Q_1$ of the capacitance $C_1$ towards the capacity $C_2$ then towards the read-out register 3. The charge $Q_O$ is retained under the intermediary capacities $C_1$ by the gate $G_O$.

On FIG. 10(k) the passage of the capacitances $C_1$ and $C_2$ at the low level provoke the return of the first training charge $Q_O$ on the columns and the transfer of $Q_S+Q_1$ in the read-out register according to the process described with reference to FIG. 8.

On the columns, to the charge $Q_O$ is added the charge noise $Q_B$ and there is a return to the situation of FIG. 10(b).

The stages represented on FIGS. 10(b) to 10(k) took place preferably during the line return time.

The second and third training charges $Q_1$ and $Q_2$ being injected in series in the CCD type shift register, they are, due to this fact, free from spatial noise, which could not be realized when the third training charge $Q_2$ was obtained by using a drain.

FIGS. 11 to 13 represent another embodiment according to the present invention of the injection device of the second and third training charges. This injection device is more particularly interesting in the case where the transfer line photosensitive device comprises two read-out register line memory assemblies situated one above and the other underneath the photosensitive matrix, allowing to read alternately the odd and even columns of this matrix, as described, for example, in French patent application No. 81 06432 in the name of the assignee. However, it is evident for the man skilled in the art that this device can also be used in the case of a single read-out register line memory assembly as described with reference to FIGS. 9 and 10.

As represented in FIG. 11, in which, for simplicity's sake, has been omitted the photosensitive matrix 1 and solely referenced by 4 the line memory, the injection devices of the second and third training charges $Q_1$ and $Q_2$ are respectively constituted by the read-out register 3 and by an auxiliary charge transfer register 11 positioned parallel to the read-out register 3 and beside it. The two registers 3 and 11 are controlled by common phases $\phi_1$ and $\phi_2$ and communicate at the level of each phase $\phi_1$, by the intermediary of a gate of passage $\phi_P$.

Insulating diffusions 12 are provided between the two registers 3 and 11 at the level of phases $\phi_2$.

Furthermore, as represented in a more detailed manner on FIG. 12(a) that is a transversal cut along A—A of FIG. 11, the read-out register is of the volume transfer type while the auxiliary register 11 is of the surface transfer type. This allows to have lower potentials in the auxiliary register than in the read-out register for a same applied voltage $\phi_1$ and consequently allows the transfer of the charges stored in the auxiliary register towards the read-out register by bearing simply the potential of the gate $\phi_P$ at the high level, as will be explained in further detail herein-after. Furthermore, to clearly separate the two transfer channels of the charges of the registers 3 and 11, an insulating diffusion 16 is provided under the gate $\phi_P$.

As represented on FIG. 11, the second and third training charges $Q_1$ and $Q_2$ are obtained by injecting a single charge $Q_e$ in the input stage and by sharing this charge $Q_e$ into two equal parts $Q_1$ and $Q_2$ by using an insulating diffusion 13 according to the process described in French patent application No. 77 28737 in the name of the assignee.

As represented on FIG. 13, the charges $Q_1$ and $Q_2$ can be obtained from two independent injection stages 14, 15 one for $Q_1$ and the other for $Q_2$.

The operation of this embodiment will now be explained with particular reference to FIGS. 11 and 12.

During the line time, the charges $Q_1$ and $Q_2$ are injected in series on each stage of the two adjacent registers 3 and 11. The training charge $Q_2$ being, first of all, used for the evacuation of charge noise, it will be injected in the read-out register 3 while the second training charge $Q_1$ will be injected in the auxiliary register.

At the beginning of line return time, the third training charge $Q_2$ injected in the read-out register 3, is transferred in the line memory 4 by positioning gate C at a low level, to be used as a charge noise training charge $Q_B$. The charge $Q_2$ is thus injected in the capacitance $C_2$ and its use as a third training charge is realized in the same way as when the charge $Q_2$ is obtained in the capacitance $C_2$ from the drain as described with reference to the FIGS. 8(a) to 8(k).

Once the whole of the charges $Q_2+Q_B$ evacuated in the drain DR, the training charge $Q_1$ is transferred from auxiliary register 11 towards the corresponding stage of the read-out register 3 by carrying the potential barrier under $\phi_P$ to a high level as represented on FIG. 12(b). Thereafter, the barrier under $\phi_P$ being brought back to the low level, the charge $Q_1$ is transferred from the read-out register 3 towards the line memory to be used as training charge of the charge signal as explained in a detailed manner with reference to FIGS. 10(h) to 10(k). The whole of the charges $Q_1+Q_S$ is thus transferred in the read-out register 3 to be sent towards the output during the following line time simultaneously with new training charges $Q_1$ and $Q_2$ being injected in registers 3 and 11.

In the embodiment of FIGS. 11 to 13 is described a surface transfer type auxiliary register. However, the auxiliary register 11 can also be of the volume transfer type, but in this case the quantity of impurities for part N must be smaller than that of the read-out register, so as to obtain an arrangement of potentials in the registers 3 and 11 such as that represented in FIG. 12(b).

FIG. 14 schematically represents an embodiment allowing the injection of the third training charge $Q_2$ with the use of a shift register.

According to the embodiment represented, the second and third training charges $Q_1$ and $Q_2$ are injected directly into a single charge transfer register, namely in the read-out register. However, the read-out register comprises a number of stages that allows to successively store the second and third charge quantities used for a line memory stage.

As represented on FIG. 14, in the case of a bi-phased operating charge transfer register, the register comprises a number of stages which is twice the number of columns. Due to this fact, the charge transfer register comprises four storing electrodes for a line memory stage. In this case, the second and third training charges $Q_1$ and $Q_2$ are strictly identical since they are injected in a single charge transfer register.

The operating of the device described herein-below will now be described.

During the line time, the charges Q giving the charges $Q_1$ or the charges $Q_2$ according to their position are injected on the whole shift register. Thereafter, the charge $Q_2$, namely the charge Q present under the storage electrode positioned opposite the gate C, is transferred in the line memory for the evacuation of the charge noise by bringing the potential of the gate C to a high level. It is obvious that the gates C are only provided between the storage electrode of the register 3 opposite the capacity $C_2$, while the insulating diffusions are provided between the other storage electrodes of the register 3 and the line memory 4.

Once the evacuation of the charge noise towards the drain is realized, the charge $Q_1$ is transferred twice in the read-out register so as to be present under the storage electrode in communication with the line memory. The charge $Q_1$ is thus transferred in the line memory to carry out the reading of the charge signal and transfer the whole of the charges $Q_1 + Q_S$ in read-out register 3, as described herein-above with reference to FIG. 8 or FIG. 10.

With bi-phase charge transfer registers, it is necessary to double the number of stages of the register to realize the injection of $Q_1$ and $Q_2$ in the same register. However, it is obvious for the man skilled in the art, that shift registers with a different number of control phases can be used. In this case, the number of stages of the read-out register does not necessarily have to be doubled. Thus, a three-phase control read-out register can be used that will only comprise three transfers for one line memory stage and that will allow to inject simultaneously the second and third charges $Q_1$ and $Q_2$ in a single read-out register.

FIG. 15 again represents another embodiment of a device allowing the injection of the second and third training charges $Q_1$ and $Q_2$ through the intermediary of a shift register.

As represented on FIG. 15, the shift register used for the injection of $Q_1$ and $Q_2$ is a register of which the storage electrodes that are not in communication with the line memory are separated in two. Each part of the electrode 17, 17' is connected respectively to a phase $\phi_1$ or $\phi'_1$. The cut-off of the electrode is preferably situated in the middle of the transfer channel and is associated to an insulating diffusion 18 that thus realizes a sharing of the charge Q into two equal parts $Q_1 = Q_2 = Q/2$. It is not necessary that the separation of the charge Q is made along two identical charges $Q_1 = Q_2 = Q/2$ from the moment that the charges $Q_1$ or the charges $Q_2$ remain identical with a sufficient value of the level at each stage of the line memory. The electrodes 19 in communication with the line memory 4 are controlled by a phase $\phi_2$ and are not shared.

An explanation will now be given with particular reference to FIG. 16 that represents the potential applied on the different phases $\phi_1$, $\phi'_1$, $\phi_2$ in function of time, the operation of the single register 3 described herein-above.

During the line time a charge Q is injected in series on each stage of the register. The control phases $\phi_1$ and $\phi'_1$ are thus constituted by identical voltages in tooths and phase $\phi_2$ is constituted by a identical voltage in tooths but in phase opposition with phases $\phi_1$ and $\phi'_1$ so as to realize the shift of the charge Q in all the stages of the register. The transfer is interrupted at the beginning of the line return time so that the charge Q is found under the electrodes 17, 17'. This charge Q is thus shared in the form $Q_1 = Q_2 = Q/2$ under each part of the electrodes 17, 17'.

At the time $t_1$, the phase $\phi'_1$ is brought to the low level which transfers the charge $Q_2$ under the electrode 19, the phase $\phi_2$ being carried to the high level. Thereafter, at the time $t_2$ the phase $\phi_2$ passes to the low level and the gate C of the line memory is simultaneously positioned at the high level. The charge $Q_2$ is thus transferred in the line memory for the evacuation of the charge noise towards the drain.

During this operation, the phase $\phi_1$ passes simultaneously to the low level to prevent the charge $Q_2$ from flowing under the electrode 17 to the right of electrode 19.

At time $T_3$ the phase $\phi_2$ is thus brought to the high level.

At this moment, the charge $Q_1$ which is present under the electrode 17 is transferred under the electrode 19, then at time $T_4$ the phase $\phi_2$ returns to the low level and transfers the charge $Q_1$ in the line memory to carry out the reading of the charge-signal in a manner known per se. The whole of the charges $Q_1 + Q_S$ is thus reinjected in the charge transfer device 3 also used as read-out register, so as to realize the reading in series of the charge signal.

Furthermore, in the case where the shift registers used for the injection of the second and third training charges do not present sufficient transfer efficiency, it is possible to overcome this drawback by using registers presenting a number of stages slightly superior to the number of stages of the line memory and by thus eliminating the first charges injected in the shift register.

We claim:

1. Analysis process of a line transfer photosensitive device, this device comprising a photosensitive zone of M lines of N photosensitive points, wherein charge signals ($Q_S$) are produced proportional to received illumination of an image; the photosensitive points of the different lines being connected in parallel by conducting columns to a memory having N intermediary capacitances, said memory ensuring the transfer towards a read-out register of the charge-signal ($Q_S$) of a single line and ensuring the transfer towards a drain of charge-noise ($Q_B$) present on the columns prior to the intake of the charge-signal wherein the analysis of each line of the photosensitive zone comprises the following steps:

transfer of the charge-signal ($Q_S$) towards the memory, by superimposing on the charge-signal at least a first training charge ($Q_O$), this first training charge ($Q_O$) being stored in the intermediary capacitances and transferred on the columns prior to the intake of the charge-signal and being sufficient to obtain in the columns, at the beginning of the transfer of the columns towards the intermediary capacitances a charge to be positioned in the high inclination zone of the characteristic $Q(t)$ of the columns.

transfer of a second training charge ($Q_1$), superimposed on the charge-signal ($Q_S$) towards the read-out register, this second training charge ($Q_1$) being read with the charge-signal ($Q_S$) and being sufficient to obtain in the intermediary capacitances at the beginning of the transfer a charge to be positioned in the high inclination zone of the characteristic $Q(t)$ of the intermediary capacitances.

2. Process according to claim 1, characterized in that the evacuation of the charge-nose ($Q_B$) present on the columns prior to the intake of the charge-signal comprises the following steps:

transfer of the charge-noise ($Q_B$) from the columns towards the memory by superimposing on it the same first training charge ($Q_O$) as for the charge-signal, the transfer having the same duration ($T_L$) as the transfer of the charge-signal of the column towards the intermediary capacitances and the first training charge ($Q_O$) still being stored in the intermediary capacitances and periodically transferred on the columns;

transfer of the charge-noise ($Q_B$) of the memory towards the drain by superimposing on it a third training charge ($Q_2$) being sufficient to obtain in the intermediary capacitances at the beginning of the transfer a charge to be positioned in the high inclination zone of the characteristic $Q(t)$ of the intermediary capacitances, this transfer having the same duration ($t_1$) as the transfer of the charge-signal ($Q_S$) of the intermediary capacitances towards the read-out register and this third training charge being evacuated with the charge-noise towards the drain.

3. Process according to claim 1, wherein the first training charge ($Q_O$) is significant with respect to the maximum value of the charge-signal ($Q_S$ max).

4. Process according to claim 1, wherein the second training charge ($Q_1$) is low with respect to the maximum value of the charge signal ($Q_S$ max).

5. Process according to claim 1, wherein the second training charge ($Q_1$) is obtained by injecting permanently this charge quantity into the read-out register and by transferring it into the memory prior to the intake of the charge-signal.

6. Process according to claim 1, wherein the second training charge ($Q_1$) is obtained by injection at the level of the intermediary capacitance ($C_2$) that comprises the memory.

7. Process according to claim 1, wherein the second training charge ($Q_1$) is obtained by illuminating by a uniform lighting of the photosensitive zone so as to generate permanently a charge that is superimposed on the charge-signal.

8. Process according to claim 7, wherein, in the case of a photosensitive zone covered by colored filters, the uniform lighting is realized in a wave length such that the transmission of the colored filters is equivalent, whatever the filter.

9. Process according to claim 2, wherein the third training charge ($Q_2$) is introduced into the memory from the drain.

10. Process according to claim 2, wherein the third training charge ($Q_2$) is obtained by injecting in series during the line time this charge quantity into a charge transfer shift register of series input and parallel outputs positioned parallel-wise to the line memory and by transferring it from the register towards the line memory.

11. Process according to claim 10, wherein the charge transfer shift register is positioned at the end of the columns of the photosensitive zone on the side opposite the line memory, the charge transfer towards the line memory being realized by the intermediary of the columns.

12. Process according to claim 10, wherein the charge transfer shift register is adjacent to the read-out register, which is constituted by a volume transfer type register, the two registers being controlled by identical control phases ($\phi_1$, $\phi_2$) and communicating at the level of one of the phases ($\phi_2$), by the intermediary of a gate of passage ($\phi_p$), the third training charge ($Q_2$) being injected in the read-out register and the second training charge ($Q_1$) in the shift register.

13. Process according to claim 12, wherein the charge transfer shift register is a volume transfer type shift register with an impurity implantation quantity lower than that of the read-out register.

14. Process according to claim 12, wherein the second and third training charges ($Q_1$, $Q_2$) are obtained by separation of a single charge ($Q_e$) injected in the input stage common to the charge transfer shift register and to the read-out register.

15. Process according to claim 12, wherein the second and third training charges ($Q_1$, $Q_2$) are separately injected by different input stages in the charge transfer shift register and in the read-out register.

16. Process according to claim 2, wherein the second and third training charges ($Q_1$, $Q_2$) are obtained by injecting in series during line time a charge quantity into the read-out register that comprises a number of stages allowing to store successively for one stage of line memory, two identical charge quantities corresponding to the second and third training charges.

17. Process according to claim 2, wherein the second and third training charges are obtained by injecting in series, during the line time, a charge quantity into the read-out register constituted by a series-parallel shift register comprising at least two storage electrodes for one line memory stage, one of the storage electrodes not communicating with the line memory being constituted by two parts of the electrodes so as to separate the injected charge into two charges, the control phase ($\phi$, $\phi_1$, $\phi_2$) applied on the different electrodes being selected in such a way as to be able to separately transfer the two charges towards the line memory.

18. Process according to claim 10, wherein the second and third training charges are injected in charge transfer shift registers comprising a number of stages superior to the number of stages of the line memory.

19. A method for an analysis process of a photosensitive device, comprising a photosensitive zone of M lines of N photosensitive points, wherein charge signals ($Q_S$) are produced proportional to received illumination of an image; the photosensitive points of the different lines being connected in parallel by conducting columns to a memory having N intermediary capacitances, said memory ensuring the transfer via a switchover means towards a read-out register of the charge-signal ($Q_S$) of a single line and ensuring the transfer via the switchover means towards a drain of charge-noise ($Q_B$) present on the columns prior to the intake of the charge-signal wherein the analysis of each line of the photosensitive zone comprises the following steps:

connect the line memory to the drain via the switchover means, transfer the noise signal ($Q_B$) to the drain, connect the line memory to the read-out register via the switchover means, transfer of the charge-signal ($Q_S$) towards the memory, by superimposing on the charge-signal at least a first training charge ($Q_O$) being stored in the intermediary capacitances and transferred on the columns prior to the intake of the charge-signal and being sufficient to obtain in the columns, at the beginning of the transfer of the columns towards the intermediary capacitances a charge to be positioned in the high inclination zone of the characteristic Q(t) of the columns, transfer of a second training charge ($Q_1$) superimposed on the charge-signal ($Q_S$) towards the read-out register, this second training charge ($Q_1$) being read with the charge-signal ($Q_S$) and being sufficient to obtain in the intermediary capacitances at the beginning of the transfer a charge to be positioned in the high inclination zone of the characteristic Q(t) of the intermediary capacitances.

20. Device according to claim 19, wherein the line memory is a double stage memory of which the switchover means are constituted by a series of capacitances, the access to each capacitance being controlled by three gates, a gate that allows the intake of the charges issuing from the intermediary capacitances and which retains the first training charge and two gates that allow the transfer of the charges towards the drain or towards the read-out register.

21. Process according to claim 4, wherein the second training charge ($Q_1$) is equal to $Q_S$ max/10.

22. Process according to claim 2, wherein the first training charge ($Q_O$) is significant with respect to the maximum value of the charge-signal ($Q_S$ max).

23. Process according to claim 16, wherein the second and third training charges are injected into charge transfer shift registers comprising a number of stages superior to the number of stages of the line memory.

24. Process according to claim 17, wherein the second and third training charges are injected into charge transfer shift registers comprising a number of stages superior to the number of stages of the line memory.

25. A method for an analysis process of a photosensitive device, comprising a photosensitive zone of M lines of N photosensitive points, wherein charge signals ($Q_S$) are produced proportional to received illumination of an image; the photosensitive points of the different lines being connected in parallel by conducting columns to a memory having N intermediary capacitances, said memory ensuring the transfer via a switchover means towards a read-out register of the charge-signal ($Q_S$) of a single line and ensuring the transfer via the switchover means towards a drain of charge-noise ($Q_B$) present on the columns prior to the intake of the charge-signal wherein the analysis of each line of the photosensitive zone comprises the following steps:

connect the line memory to the drain via the switchover means, transfer the noise signal ($Q_B$) to the drain, connect the line memory to the read-out register via the switchover means, transfer of the charge-signal ($Q_S$) towards the memory, by superimposing on the charge-signal at least a first training charge ($Q_O$) being stored in the intermediary capacitances and transferred on the columns prior to the intake of the charge-signal and being sufficient to obtain in the columns, at the beginning of the transfer of the columns towards the intermediary capacitances a charge to be positioned in the high inclination zone of the characteristic Q(t) of the columns, transfer of a second training charge ($Q_1$) superimposed on the charge-signal ($Q_S$) towards the read-out register, this second training charge ($Q_1$) being read with the charge-signal ($Q_S$) and being sufficient to obtain in the intermediary capacitances at the beginning of the transfer a charge to be positioned in the high inclination zone of the characteristic Q(t) of the intermediary capacitances, and wherein the evacuation of the charge-noise ($Q_B$) present on the columns prior to the intake of the charge-signal comprises the following steps:

transfer of the charge-noise ($Q_B$) from the columns towards the memory by superimposing on it the charge-signal, the transfer having the same duration ($T_L$) as the transfer of the charge-signal of the column towards the intermediary capacitances and the first training charge ($Q_O$) still being stored in the intermediary capacitances and periodically transferred on the columns;

transfer of the charge-noise ($Q_B$) of the memory towards the drain by superimposing on it a third training charge ($Q_2$) being sufficient to obtain in the intermediary capacitances at the beginning of the transfer a charge to be positioned in the high inclination zone of the Q(t) of the intermediary capacitances, this transfer having the same duration ($t_1$) as the transfer of the charge-signal ($Q_S$) of the intermediary capacitances towards the read-out register and this third training charge being evacuated with the charge-noise towards the drain.

26. Device according to claim 25, wherein the line memory is a double stage memory of which the switchover means are constituted by a series of capacitances, the access to each capacitance being controlled by three gates, a gate that allows the intake of the charges issuing from the intermediary capacitances and which retains the first training charge and two gates that allow the transfer of the charges towards the drain or towards the read-out register.

* * * * *